US012805058B2

(12) United States Patent
Zhang et al.

(10) Patent No.: US 12,805,058 B2
(45) Date of Patent: Nov. 17, 2026

(54) SOLAR CELL AND PHOTOVOLTAIC MODULE

(71) Applicants: ZHEJIANG JINKO SOLAR CO., LTD., Haining (CN); JINKO SOLAR CO., LTD., Jiangxi (CN)

(72) Inventors: Yuanfang Zhang, Haining (CN); Menglei Xu, Haining (CN); Jie Yang, Haining (CN); Xinyu Zhang, Haining (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 63 days.

(21) Appl. No.: 18/615,991

(22) Filed: Mar. 25, 2024

(65) Prior Publication Data

US 2025/0143010 A1 May 1, 2025

(30) Foreign Application Priority Data

Oct. 31, 2023 (CN) ......................... 202311437524.2

(51) Int. Cl.
*H10F 77/30* (2025.01)
*H10F 10/142* (2025.01)
*H10F 19/80* (2025.01)

(52) U.S. Cl.
CPC ......... *H10F 77/311* (2025.01); *H10F 10/142* (2025.01); *H10F 19/80* (2025.01)

(58) Field of Classification Search
CPC ....... H10F 10/142; H10F 19/80; H10F 77/311
See application file for complete search history.

(56) References Cited

U.S. PATENT DOCUMENTS

2008/0190479 A1* 8/2008 Hsieh .................... H10F 10/161 136/246
2009/0194161 A1* 8/2009 Ji .......................... H10F 77/707 438/98

(Continued)

FOREIGN PATENT DOCUMENTS

CN 101232055 A 7/2008
CN 102956738 A 3/2013

(Continued)

OTHER PUBLICATIONS

Zhejiang Jinko Solar Co., Ltd., et al., Extended European Search Report, EP 24163747.9, Sep. 17, 2024, 8 pgs.

(Continued)

*Primary Examiner* — Lindsey A Buck
(74) *Attorney, Agent, or Firm* — USCH Law, PC

(57) ABSTRACT

Embodiments of the present disclosure relate to a solar cell and a photovoltaic module. The solar cell includes a bottom cell, a recombination layer, and a top cell stacked in a first direction. The bottom cell includes at least one first electrode, a first semiconductor conductive layer, a substrate, and a second semiconductor conductive layer stacked in the first direction. The recombination layer includes a dielectric layer and a first transparent conductive layer stacked in the first direction, the second semiconductor conductive layer has a first surface facing towards the top cell, and the dielectric layer is formed on at least a portion of the first surface. In this way, the photoelectric conversion efficiency of the solar cell can be at least improved.

15 Claims, 5 Drawing Sheets

(56) References Cited

U.S. PATENT DOCUMENTS

| | | | | |
|---|---|---|---|---|
| 2016/0126401 | A1* | 5/2016 | Iannelli | H10F 10/19 438/66 |
| 2018/0158976 | A1* | 6/2018 | Ahn | H10F 71/121 |
| 2022/0209039 | A1* | 6/2022 | Lee | H10F 77/315 |
| 2022/0384527 | A1 | 12/2022 | Robinson et al. | |

FOREIGN PATENT DOCUMENTS

| | | | |
|---|---|---|---|
| CN | 106058054 | A | 10/2016 |
| CN | 108172645 | A | 6/2018 |
| CN | 113594372 | A | 11/2021 |
| CN | 114203757 | A | 3/2022 |
| CN | 114530524 | A | 5/2022 |
| CN | 217655887 | U | 10/2022 |
| CN | 115274885 | A | 11/2022 |
| CN | 116113244 | A | 5/2023 |
| CN | 115996583 | B | 6/2023 |
| KR | 102246070 | B1 | 4/2021 |
| KR | 1020230027628 | A | 2/2023 |

OTHER PUBLICATIONS

Zhejiang Jinko Solar Co., Ltd., et al., Extended European Search Report, EP 24163308.0, Sep. 5, 2024, 10 pgs.

* cited by examiner

SOLAR CELL AND PHOTOVOLTAIC MODULE

CROSS REFERENCE TO RELATED APPLICATIONS

The present application claims the benefit of priority under the Paris Convention to Chinese Patent Application No. 202311437524.2 filed on Oct. 31, 2023, which is incorporated herein by reference in its entirety.

TECHNICAL FIELD

Embodiments of the present disclosure relate to the technical field of solar cells, and in particular to a solar cell and a photovoltaic module.

BACKGROUND

Fossil energy causes air pollution and has limited reserves, while solar energy has the advantages of cleanness, non-pollution and abundant resources. Therefore, solar energy is gradually becoming the core clean energy replacing fossil energy. Because solar cells have good photoelectric conversion efficiency, solar cells have become the focus of development of clean energy.

In order to improve the efficiency of a solar cell and the utilization rate of incident light as much as possible, it is currently common to stack semiconductor cell sheets with different energy gaps to form a tandem solar cell, thereby increasing the utilization rate of solar energy as much as possible and improving the photoelectric conversion efficiency of the tandem solar cell. However, the actual photoelectric conversion efficiency of the existing tandem solar cell has a large deviation from the theoretical efficiency, the structure of the tandem solar cell needs to be optimized, and the photoelectric conversion efficiency needs to be improved.

SUMMARY

Embodiments of the present disclosure provide a solar cell and a photovoltaic module, which at least improve the photoelectric conversion efficiency of the solar cell.

Some embodiments of the present disclosure provide a solar cell, including a bottom cell, a recombination layer, and a top cell stacked in a first direction. The bottom cell includes at least one first electrode, a first semiconductor conductive layer, a substrate, and a second semiconductor conductive layer stacked in the first direction. The recombination layer includes a dielectric layer and a first transparent conductive layer stacked in the first direction, the second semiconductor conductive layer has a first surface facing towards the top cell, and the dielectric layer is formed on at least a portion of the first surface.

In some embodiments, a ratio of an area of an orthographic projection of the dielectric layer on the first surface to an area of the first surface ranges from 0.5 to 1.

In some embodiments, in the first direction, a ratio of a thickness of the dielectric layer to a thickness of the recombination layer ranges from 0.025 to 0.5.

In some embodiments, in the first direction, a thickness of the dielectric layer ranges from 0.5 nm to 5 nm.

In some embodiments, in the first direction, a thickness of the first transparent conductive layer ranges from 1 nm to 20 nm.

In some embodiments, the first transparent conductive layer is formed on the dielectric layer and covers one or more portions of the first surface that are not covered by the dielectric layer.

In some embodiments, the dielectric layer covers the first surface, and the first transparent conductive layer is formed on the dielectric layer.

In some embodiments, a material of the dielectric layer includes silicon oxide, silicon nitride, silicon carbide, aluminum oxide, or silicon oxynitride.

In some embodiments, the dielectric layer includes at least one hole passing through the dielectric layer. The solar cell further includes a fill structure, the fill structure fills up the at least one hole, and transparency of a material of the fill structure is greater than or equal to transparency of a material of the dielectric layer.

In some embodiments, the dielectric layer includes at least two dielectric portions, and the at least one hole spaces apart adjacent dielectric portions of the at least two dielectric portions.

In some embodiments, the at least two dielectric portions interleave with the at least one hole along a second direction.

In some embodiments, the solar cell further includes a plurality of second electrodes formed at intervals along a third direction. The plurality of second electrodes are formed on a surface of the top cell away from the bottom cell in the first direction, and at least part of orthographic projections of the plurality of second electrodes on the dielectric layer is located on the at least two dielectric portions.

In some embodiments, the second direction and the third direction have a same orientation, or are parallel to each other and have opposite orientations.

In some embodiments, the orthographic projections of the plurality of second electrodes on the dielectric layer is located on the at least two dielectric portions.

In some embodiments, a ratio of an area of an orthographic projection of the at least one hole on the first surface to an area of orthographic projections of the at least two dielectric portions on the first surface ranges from 0 to 10.

In some embodiments, the bottom cell further includes a tunneling layer and a first passivation layer. The tunneling layer is disposed between the second semiconductor conductive layer and the substrate. The first passivation layer is disposed on a surface of the first semiconductor conductive layer away from the substrate, and the at least one first electrode penetrates through the first passivation layer and is in ohmic contact with the first semiconductor conductive layer.

In some embodiments, the top cell includes a perovskite thin-film solar cell, a copper indium gallium diselenide thin-film solar cell, a cadmium telluride thin-film solar cell, an amorphous silicon thin-film solar cell, or a group-III-to-V thin-film solar cell.

In some embodiments, the top cell further includes a second transparent conductive layer having a refractive index decreasing in stages along the first direction.

Some embodiments of the present disclosure provide a photovoltaic module, including: at least one cell string, formed by connecting a plurality of solar cells as above-mentioned, at least one encapsulation layer configured to cover a surface of the at least one cell string, and at least one cover plate configured to cover a surface of the at least one encapsulation layer away from the at least one cell string.

BRIEF DESCRIPTION OF THE DRAWINGS

One or more embodiments are exemplarily illustrated in reference to corresponding accompanying drawing(s), and these exemplary illustrations do not constitute limitations on the embodiments. Unless otherwise stated, the accompanying drawings do not constitute scale limitations.

DETAILED DESCRIPTION OF THE EMBODIMENTS

When a certain part "includes" another part throughout the specification, other parts are not excluded unless otherwise stated, and other parts may be further included. In addition, when parts such as a layer, a film, a region, or a plate is referred to as being "on" another part, it may be "directly on" another part or may have another part present therebetween. In addition, when a part of a layer, film, region, plate, etc., is "directly on" another part, it means that no other part is positioned therebetween.

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise.

It is known from the BACKGROUND that the photoelectric conversion efficiency of existing tandem solar cells needs to be improved.

Figure 1:
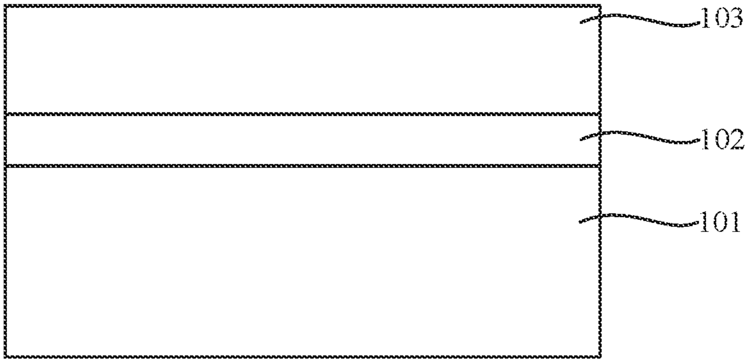
FIG. 1 is a schematic diagram of an overall structure of an existing tandem solar cell.

In some embodiments, referring to FIG. 1, an existing tandem solar cell includes a bottom cell 101, an intermediate layer 102, and a top cell 103 which are stacked.

Typically, during production of the tandem solar cell, the bottom cell 101 is provided first. The bottom cell 101 generally includes a first electrode layer, a first semiconductor conductive layer, a substrate, a second semiconductor conductive layer, and a second electrode layer which are stacked. Then, the intermediate layer 102 may be formed on the second electrode layer, and a transparent conductive film having a certain thickness may generally serve as the intermediate layer 102. At last, the top cell 103 is formed on a surface of the intermediate layer 102 away from the bottom cell 101, and the intermediate layer 102 connects the bottom cell 101 with the top cell 103.

The transparent conductive film includes a metal film system, an oxide film system, other compound film systems, a polymer film system, a composite film system, or the like. In order to balance the electrical conductivity and the transparency, the film system of the transparent conductive film in the tandem solar cell is usually an oxide film system, and the material of the transparent conductive film includes indium tin oxide, indium zirconium oxide, hydrogen-doped indium oxide, or aluminum-doped zinc oxide, or the like.

During formation of a tandem solar cell, a double-ended tandem solar cell is usually formed for convenience of use. The double-ended tandem solar cell refers to that electrodes of the bottom cell 101 on a side away from the top cell 103 function as bottom electrodes of the tandem solar cell, top electrodes are formed on a side of the top cell 103 away from the bottom cell 101, the bottom cell 101 and the top cell 103 are connected in series by the intermediate layer 102, and carriers generated in the bottom cell 101 and the top cell 103 are output via the bottom electrodes and the top electrodes.

During formation of the double-ended tandem solar cell, a passivation layer and an electrode structure on a side of the bottom cell 101 are generally removed, and then the intermediate layer 102 is formed on an exposed semiconductor conductive layer of the bottom cell 101, and the top cell 103 is formed on a side of the intermediate layer 102 away from the bottom cell 101. The parasitic light absorption in the tandem solar cell can be reduced by connecting the bottom cell 101 and the top cell 103 in series by the intermediate layer 102.

Some embodiments of the present disclosure provide a solar cell. An electrode structure on a side of the bottom cell is removed, and the recombination layer functions as an intermediate layer to contact with the top cell and the bottom cell. The recombination layer includes the dielectric layer and the first transparent conductive structure stacked in the first direction, and the dielectric layer is conducive to enhancing tunneling capability of carriers in the recombination layer, thereby reducing recombination loss of the carriers in the recombination layer. Since the dielectric layer is disposed on the second semiconductor conductive layer of the bottom cell, the dielectric layer functions as a protection film, which is capable of effectively reducing damages to the second semiconductor conductive layer during formation of the first transparent conductive layer, thereby ensuring that the bottom cell has a higher open-circuit voltage and a better photoelectric conversion performance. In addition, the dielectric layer can further provide surface passivation to the second semiconductor conductive layer, such that interface defects of the second semiconductor conductive layer can be reduced. In this way, the open-circuit voltage of the bottom cell can be increased, the recombination of carriers on a surface of the second semiconductor conductive layer of the bottom cell can be reduced, thereby improving the photoelectric conversion efficiency of the bottom cell and the tandem solar cell.

Embodiments of the present disclosure will be described in detail below with reference to the accompanying drawings. Those skilled in the art should understand that, in the embodiments of the present disclosure, many technical details are provided for the reader to better understand the present disclosure. However, even without these technical details and various modifications and variants based on the following embodiments, the technical solutions claimed in the present disclosure can be implemented.

Figure 2:
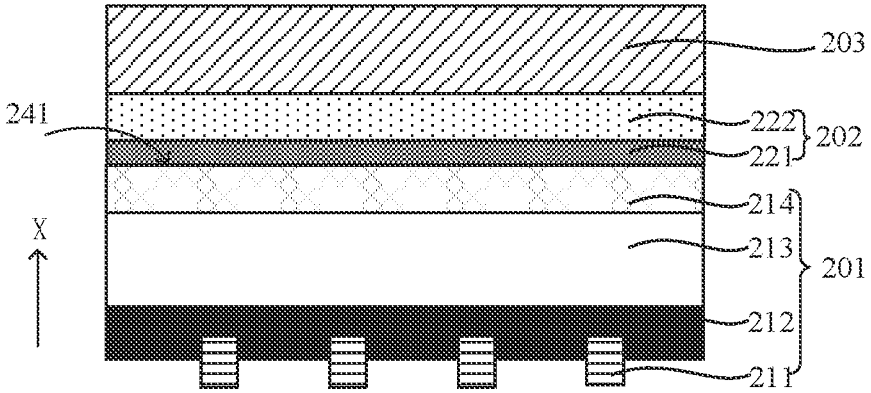
FIG. 2 is a schematic diagram of an overall structure of a tandem solar cell according to some embodiments of the present disclosure.

Some embodiments of the present disclosure provide a solar cell. Referring to FIG. 2, FIG. 2 is a schematic diagram of an overall structure of another tandem solar cell. In FIG. 2, X direction refers to the first direction.

The solar cell includes: a bottom cell 201, a recombination layer 202, and a top cell 203 stacked in the first direction. The bottom cell 201 includes a first electrode 211, at least one first semiconductor conductive layer 212, a substrate 213, and a second semiconductor conductive layer 214 stacked in the first direction. The recombination layer 202 includes a dielectric layer 221 and a first transparent conductive layer 222 stacked in the first direction, the second semiconductor conductive layer 214 has a first surface 241 facing to the top cell 203, and the dielectric layer 221 is formed on at least a portion of the first surface 241.

Since the recombination layer 202 includes the dielectric layer 221 and the first transparent conductive layer 222 stacked in the first direction, and the dielectric layer 221 faces towards the bottom cell 201, in a case where an electrode structure of the bottom cell 201 on a side facing to the top cell 203 is removed and the bottom cell 201 is in direct contact with the recombination layer 202 via the second semiconductor conductive layer 214, the dielectric layer 221 can effectively enhance tunneling capability of carriers in the recombination layer 202, thereby effectively reducing recombination loss of the carriers in the recombination layer. The dielectric layer 221 is disposed on the second semiconductor conductive layer 214 of the bottom cell 201, thus the dielectric layer 221 functions as a protection film covering the second semiconductor conductive layer 214, which is capable of effectively reducing damages to the second semiconductor conductive layer 214 during formation of the first transparent conductive layer 222, thereby ensuring that the bottom cell 201 has a higher open-circuit voltage and a better photoelectric conversion performance. In addition, the dielectric layer 221 can further provide surface passivation to the second semiconductor conductive layer 214, such that interface defects of the second semiconductor conductive layer 214 can be reduced. In this way, the open-circuit voltage of the bottom cell 201 can be increased, the recombination of carriers on a surface of the second semiconductor conductive layer 214 of the bottom cell 201 can be reduced, thereby improving the photoelectric conversion efficiency of the bottom cell 201 and the tandem solar cell.

In the process of producing the solar cell, the bottom cell 201 having a complete cell structure may be provided first, then the electrode structure on a side of the bottom cell 201 is removed by means of physical etching or chemical etching. In the case where the bottom cell 201 further has an anti-reflection layer for reducing light reflection under the removed electrode structure, the anti-reflection layer of the bottom cell 201 is etched to expose a semiconductor conductive layer on the side of the bottom cell 201. Then, the recombination layer 202 is formed on the exposed semiconductor conductive layer of the bottom cell 201, and the top cell 203 is formed on a side of the recombination layer 202 away from the bottom cell 201. It is also possible to adjust the process flow for the bottom cell 201, a semiconductor conductive layer on a side of the bottom cell 201 is reserved, and then the recombination layer 202 and the top cell 203 are directly formed on the reserved semiconductor conductive layer. The recombination layer 202 may be formed by depositing the dielectric layer 221 and the first transparent conductive layer 222 of the recombination layer 202 using a physical or chemical deposition process.

It should be understood that FIG. 2 shows a cross-sectional view of a recombination layer 202 along the first direction in which the dielectric layer 221 completely covers the first surface 241. In some other embodiments, the dielectric layer 221 may cover only a portion of the first surface 241 of the second semiconductor conductive layer 214.

In addition, the material and structure of the first transparent conductive layer 222 of the recombination layer 202 may be the same as those of the aforementioned transparent conductive film serving as the intermediate layer 102, and the material and structure of the first transparent conductive layer 222 are not described in detail herein any further.

In some embodiments, the bottom cell 201 may be a monocrystalline silicon solar cell, a polycrystalline silicon solar cell, an amorphous silicon solar cell, or a microcrystalline silicon cell. The substrate 213 may be a P-type semiconductor substrate or an N-type semiconductor substrate. A doping type of one of the first semiconductor conductive layer 212 and the second semiconductor conductive layer 214 may be P type, a doping type of the other may be N type, and dopant concentration of the semiconductor conductive layer having the same doping type as that of the substrate 213 is greater than dopant concentration of the substrate 213. An N-type doping element is doped into the N-type semiconductor substrate. The N-type doping element may be any one of group-V elements, such as potassium (P), bismuth (Bi), antimony (Sb), or arsenic (As). A P-type doping element is doped into the P-type semiconductor substrate. The P-type doping element may be any one of group-III elements, such as boron (B), aluminum (Al), gallium (Ga), or indium (In).

Further, the bottom cell 201 may be a one-piece cell or a sliced cell. A sliced cell refers to a cell formed by performing a cutting process on a complete one-piece cell.

In some embodiments, the substrate 213 may be made of an elemental semiconductor material. In some embodiments, the elemental semiconductor material includes a single element, for example, silicon or germanium. The elemental semiconductor material may be in a monocrystalline state, a polycrystalline state, an amorphous state, or a microcrystalline state (referred to a state in which a monocrystalline state and an amorphous state present concurrently). For example, silicon may be at least one of monocrystalline silicon, polycrystalline silicon, amorphous silicon, or microcrystalline silicon.

In some embodiments, the substrate 213 may also be made of a compound semiconductor material. Typical compound semiconductor materials include, but are not limited to, silicon germanium, silicon carbide, gallium arsenide, indium gallide, perovskite, cadmium telluride, copper indium selenium, or other materials. The substrate 213 may be a sapphire substrate, a silicon substrate on an insulator, or a germanium substrate on an insulator.

Figure 3:
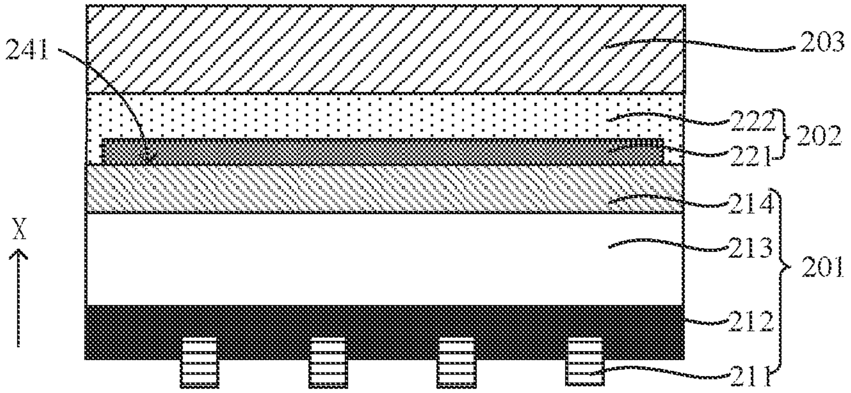
FIG. 3 is a schematic diagram of an overall structure of another tandem solar cell according to some embodiment of the present disclosure.

Referring to FIG. 2 and FIG. 3, in some embodiments, the first transparent conductive layer 222 covers a surface of the dielectric layer 221 and one or more portions of the first surface 241 that are not covered by the dielectric layer 221. FIG. 3 is a schematic diagram of an overall structure of another tandem solar cell according to some embodiments of the present disclosure.

The main function of the recombination layer 202 is to serve as an intermediate layer connecting the bottom cell 201 with the top cell 203. Thus, the conductive performance of the recombination layer 202 may affect the photoelectric conversion efficiency of the tandem solar cell. With regard to the first transparent conductive layer 222, in the case where the dielectric layer 221 only covers a portion of the first surface 241 and the first transparent conductive layer 222 is not in contact with the second semiconductor conductive layer 214, the first transparent conductive layer 222 is connected to the second semiconductor conductive layer 214 via the dielectric layer 221, and transfer of carriers needs to be achieved by the dielectric layer 221. In this case, carriers in the one or more portions of the second semiconductor conductive layer 214 which are not covered by the dielectric layer 221 cannot be transferred to the first transparent conductive layer 222 in time and effectively, and recombination loss of carriers occurred between the top cell 203 and the bottom cell 201 is relatively large.

Therefore, when the first surface 241 is not completely covered by the dielectric layer 221, the first transparent conductive layer 222 may be disposed to be in local contact with the second semiconductor conductive layer 214. That is, the first transparent conductive layer 222 and the second semiconductor conductive layer 214 define an enclosed cavity accommodating the dielectric layer 221, such that the one or more portions of the first surface 241 of the second semiconductor conductive layer 214 which are not covered by the dielectric layer 221 are covered by the first transparent conductive layer 222. That is to say, the first transparent conductive layer 222 covers the surface of the dielectric layer 221 and the one or more portions of the first surface 241 which are not covered by the dielectric layer 221. In this way, transfer of carriers between the first transparent conductive layer 222 and the second semiconductor conductive layer 214 may be achieved by the dielectric layer 221 or the first surface 241 in contact with the first transparent conductive layer 222, such that recombination loss of carriers occurred between the recombination layer 202 and the bottom cell 201 can be reduced.

Figure 4:
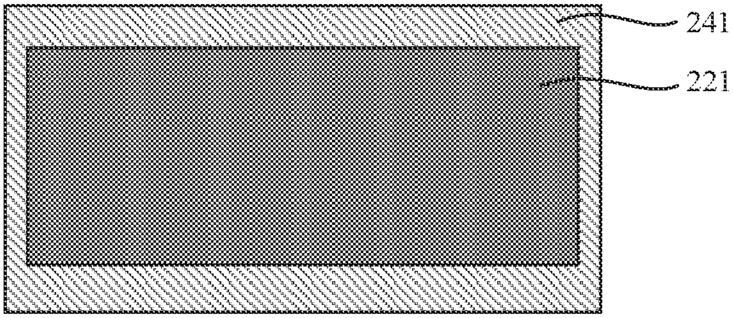
FIG. 4 is a structural schematic diagram of an orthographic projection of a dielectric layer on a first surface according to some embodiments of the present disclosure.

Referring to FIG. 3 and FIG. 4, in some embodiments, a ratio of an area of an orthographic projection of the dielectric layer 221 on the first surface 241 to an area of the first surface 241 ranges from 0.5 to 1. FIG. 4 is a structural schematic diagram of an orthographic projection of the dielectric layer 221 on the first surface 241.

When the dielectric layer 221 is a regular film layer, the area of the orthographic projection of the dielectric layer 221 on the first surface 241 may be regarded as an area of a portion of the first surface 241 covered by the dielectric layer 221. Therefore, the ratio of the area of the orthographic projection of the dielectric layer 221 on the first surface 241 to the area of the first surface 241 may be regarded as a coverage ratio of the dielectric layer 221 to the first surface 241. When forming the recombination layer 202 using the dielectric layer 221 and the first transparent conductive layer 222 stacked in the first direction, the greater the coverage ratio of the dielectric layer 221 to the first surface 241, the greater the protection capability of the dielectric layer 221 to the first transparent conductive layer 222, the better the surface passivation effect on the first transparent conductive layer 222, and the greater the improvement of tunneling capability of carriers in the recombination layer 202 by the dielectric layer 221.

With the dielectric layer 221 of the recombination layer 202, the tunneling capability of carriers in the recombination layer 202 can be effectively improved by the dielectric layer 221. Moreover, since the material of the dielectric layer 221 has transparency generally weaker than that of the material of the first transparent conductive layer 222, the dielectric layer 221 may affect the light transmittance of the recombination layer 202. When the coverage ratio of the dielectric layer 221 to the first surface 241 is excessively small, the impact on the photoelectric conversion efficiency of the bottom cell 201 due to decrease in the light transmittance is greater than the influence on the photoelectric conversion efficiency of the bottom cell 201 due to improvement of the surface passivation effect.

Thus, when forming the recombination layer 202, the ratio of the area of the orthographic projection of the dielectric layer 221 on the first surface 241 to the area of the first surface 241 may be set within the range of 0.5 to 1, for example, 0.52, 0.55, 0.6, 0.65, 0.75, 0.85, 0.95, or the like. By setting the coverage ratio of the dielectric layer 221 to the first surface 241 within a suitable range, the tunneling capability of carriers in the recombination layer 202 can be effectively enhanced, and the recombination current on the surface of the second semiconductor conductive layer 214 of the bottom cell 201 can be effectively reduced, thereby improving the photoelectric conversion efficiency of the tandem solar cell.

In FIG. 4, a top view of the dielectric layer 221 on the first surface 241 is shown, where the dielectric layer 221 does not completely cover the first surface 241. In some embodiments, the dielectric layer 221 may be formed to completely cover the first surface 241, and the first transparent conductive layer 222 covers a surface of the dielectric layer 221. That is, the ratio of the area of the orthographic projection of the dielectric layer 221 on the first surface 241 to the area of the first surface 241 equal to 1, such that the passivation and protection effects on the second semiconductor conductive layer 214 by the dielectric layer 221 can be enhanced as much as possible.

Referring to FIG. 2, in some embodiments, in the first direction, a thickness of the recombination layer 202 ranges from 2.5 nm to 25 nm.

The thickness of the recombination layer 202 in the first direction refers to an average distance h1 in the first direction between a surface of the recombination layer 202 in contact with the second semiconductor conductive layer 204 and a surface of the recombination layer 202 in contact with the top cell 203. The main function of the recombination layer 202 is to connect the bottom cell 201 with the top cell 203, such that transfer and recombination of carriers between the bottom cell 201 and the top cell 203 can be achieved. The photoelectric conversion efficiency of the tandem solar cell is influenced by the recombination layer 202 in two aspects. One is the influence on the carrier recombination efficiency between the bottom cell 201 and the top cell 203 by the resistance characteristic of the recombination layer 202, and the other is the influence on the light absorption amount of the bottom cell 201 by the parasitic light absorption of the recombination layer 202.

Thus, the thickness of the recombination layer 202 in the first direction may be set within the range of 2.5 nm to 25 nm, for example, 3 nm, 3.5 nm, 4.5 nm, 5.5 nm, 7.5 nm, 10 nm, 12.5 nm, 16 nm, 19 nm, 23.5 nm, or the like. By setting the thickness of the recombination layer 202 within a suitable range, the recombination loss of carriers in the recombination layer 202 can be reduced, such that the recombination layer 202 can have less parasitic light absorption, thereby increasing the light absorption amount of the bottom cell 201 and reducing the recombination loss of carriers occurred between the bottom cell 201 and the top cell 203. In this way, the photoelectric conversion efficiency of the tandem solar cell can be improved.

In some embodiments, in the first direction, a ratio of a thickness of the dielectric layer 221 to a thickness of the recombination layer 202 ranges from 0.025 to 0.5.

The thickness of the dielectric layer 221 in the first direction refers to an average distance h2 between a surface of the dielectric layer 221 in contact with the first surface 241 and a surface of the dielectric layer 221 away from the bottom cell 201 along the first direction. With reference to the above description of the dielectric layer 221, one of the main functions of the dielectric layer 221 is to enhance the tunneling capability of carriers in the recombination layer 202 and to provide protection and surface passivation to the second semiconductor conductive layer 214. However, the dielectric layer 221 may affect the transparency of the recombination layer 202, and the greater the thickness of the dielectric layer 221 in the first direction, the poorer the transparency of the recombination layer 202.

Thus, when forming the recombination layer 202, the ratio of the thickness of the dielectric layer 221 in the first direction to the thickness of the recombination layer 202 in the first direction may be set within the range of 0.025 to 0.5, for example, 0.05, 0.075, 0.1, 0.125, 0.15, 0.2, 0.25, 0.325, 0.4, 0.45, or the like. By setting the proportion of the thickness of the dielectric layer 221 in the recombination layer 202 within a suitable range, the dielectric layer 221 can effectively improve the tunneling capability of carriers in the recombination layer 202, provide good surface passivation and protection to the second semiconductor conductive layer 214, and reduce the loss in transparency of the recombination layer 202 caused by forming the dielectric layer 221. In this way, the impact on the light absorption amount of the bottom cell 201 by the recombination layer 202 and the recombination loss of carriers occurred between the bottom cell 201 and the top cell 203 can be reduced, and the bottom cell 201 and the tandem solar cell can have good photoelectric conversion efficiency.

In some embodiments, in the first direction, a thickness of the first transparent conductive layer 222 ranges from 1 nm to 20 nm.

The thickness of the first transparent conductive layer 222 in the first direction refers to an average distance h3 between two opposite surfaces of the first transparent conductive layer 222 in the first direction. The primary function of the first transparent conductive layer 222 is to enable good recombination efficiency of holes generated in one of the bottom cell 201 and the top cell 203 with electrons generated in the other, and implement series connection between the bottom cell 201 and the top cell 230. The recombination efficiency of carriers in the first transparent conductive layer 222 is related to the resistance characteristic of the first transparent conductive layer 222. When the contact area is unchanged, the larger the thickness in the first direction, the lower the resistance characteristic of the first transparent conductive layer 222, and the lower the recombination loss of carriers.

In addition, the thickness of the first transparent conductive layer 222 in the first direction also affects the light absorption thereof. The greater the thickness of the first transparent conductive layer 222, the greater the absorption of the light passing through the top cell 203 by the first transparent conductive layer. Therefore, when the thickness of the first transparent conductive layer 222 is too large, the proportion of the light passing through the top cell 203 and received by the bottom cell 201 is significantly decreased, thereby resulting in a significant decrease in the light absorption amount of the bottom cell 201, and in a limit on the photoelectric conversion efficiency of the bottom cell 201.

Thus, when forming the recombination layer 202, the thickness of the first transparent conductive layer 222 in the first direction may be set within the range of 1 nm to 20 nm, for example, 1.5 nm, 2 nm, 3 nm, 4 nm, 5.5 nm, 7 nm, 9 nm, 11 nm, 13.5 nm, 16 nm, 18.5 nm, or the like. By setting the thickness of the first transparent conductive layer 222 within a suitable range, the first transparent conductive layer 222 can have good conductive performance, and the light absorption capability of the first transparent conductive layer 222 can be limited to a small range. In this way, the absorption of the light passing through the top cell 203 by the recombination layer 202 can be reduced, the light absorption amount of the bottom cell 201 can be increased, and the overall photoelectric conversion efficiency of the tandem solar cell can be improved.

In some embodiments, in the first direction, the thickness of the dielectric layer 221 ranges from 0.5 nm to 5 nm.

With reference to the above description of the dielectric layer 221, in order to ensure that the dielectric layer 221 can effectively enhances the tunneling capability of carriers in the recombination layer 202, and to prevent excessive decrease in the optical transparency of the recombination layer 202 caused by disposing the dielectric layer 221, the ratio of the thickness of the dielectric layer 221 in the first direction to the thickness of the recombination layer 202 in the first direction may be generally set within a suitable range, such as 0.05 to 0.5, 0.1 to 0.45, 0.15 to 0.3, or the like.

When forming the dielectric layer 221, in addition to the influence on the tunneling capability of carriers in the dielectric layer by the thickness of the dielectric layer 221 in the first direction, the protection and surface passivation effects on the second semiconductor conductive layer 214 provided by the dielectric layer 221 also need to be considered. When the thickness of the dielectric layer 221 in the first direction is excessively small, the tunneling capability of carriers in the dielectric layer 211 is poor, such that the tunneling capability of carriers in the recombination layer 202 cannot be effectively improved, and an effective protection and surface passivation cannot be provided to the second semiconductor conductive layer 214. When the thickness of the dielectric layer 221 in the first direction is excessively large, the transparency of the dielectric layer 221 is greatly reduced, resulting in great decrease in the light absorption amount of the bottom cell 201, thereby affecting the photoelectric conversion efficiency of the bottom cell 201.

Accordingly, the thickness of the dielectric layer 221 in the first direction may be set within the range of 0.5 nm to 5 nm, for example, 0.55 nm, 0.65 nm, 0.75 nm, 0.9 nm, 1.05 nm, 1.25 nm, 1.5 nm, 1.8 nm, 2 nm, 2.5 nm, 3.5 nm, 4.25 nm, or the like. By setting the thickness of the dielectric layer 221 in the first direction within a suitable range, the dielectric layer 221 can effectively enhance the tunneling capability of carriers in the recombination layer 202, reduce the damage to the second semiconductor conductive layer 214 during the formation of the first transparent conductive layer 222, reduce carrier recombination on the surface of the second semiconductor conductive layer 214, and control the loss in transparency of the recombination layer 202 in a relatively small range, thereby reducing the loss in light absorption of the bottom cell 201. In this way, the photoelectric conversion efficiency of the bottom cell 201 can be ensured, the recombination loss of carriers occurred between the bottom cell 201 and the top cell 203 can be reduced, and the fill factor and photoelectric conversion efficiency of the tandem solar cell can be improved.

In some embodiments, the material of the dielectric layer 221 includes silicon oxide, silicon nitride, silicon carbide, aluminum oxide, or silicon oxynitride. The material of the dielectric layer 221 may be a semiconductor material having a good carrier tunneling capability, and during forming the dielectric layer 221, at least one material of silicon oxide, silicon nitride, silicon carbide, aluminum oxide, silicon oxynitride, or magnesium fluoride may be used to form the dielectric layer 221, and the material of the dielectric layer 221 is not limited in the embodiments of the present disclosure.

Figure 5:
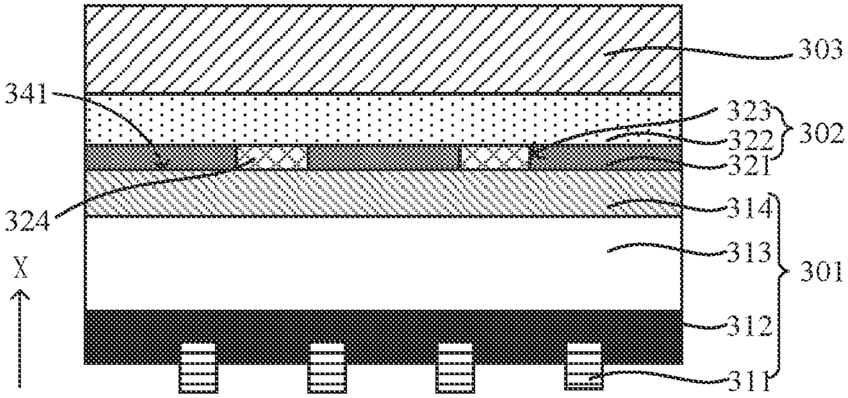
FIG. 5 is a schematic diagram of an overall structure of yet another tandem solar cell according to some embodiments of the present disclosure.
Figure 6:
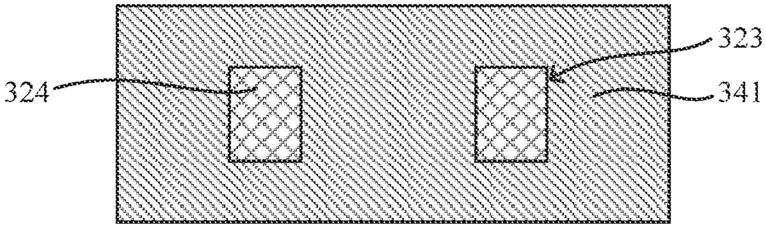
FIG. 6 is a top view of a dielectric layer on the first surface according to some embodiments of the present disclosure.

Referring to both FIG. 5 and FIG. 6, in some embodiments, the dielectric layer 321 includes at least one hole 323 passing through the thickness of the dielectric layer 321. The solar cell further includes a fill structure 324 filling up the at least one hole 323, and transparency of a material of the fill structure 324 is greater than or equal to transparency of the material of the dielectric layer 321. FIG. 5 is a schematic diagram of an overall structure of yet another tandem solar cell, and FIG. 6 is a top view of the dielectric layer 321 on the first surface 341. In FIG. 6, X direction refers to the first direction.

A bottom cell 301 is similar to the bottom cell 201 as described above, a top cell 303 is similar to the top cell 203 as described above, and a first transparent conductive layer 322 is similar to the first transparent conductive layer 222 as described above, which are not described in detail herein any further.

Since disposing the dielectric layer 321 may result in decrease in the optical transparency of the recombination layer 302, when forming the dielectric layer 321 and the recombination layer 302, at least one hole 323 passing through the thickness of the dielectric layer 321 may be formed in the dielectric layer 321, and then the fill structure 324 filled up the at least one hole 323 may be formed in the at least one hole 323, the material of the fill structure 324 has transparency greater than or equal to transparency of the material of the dielectric layer 321.

By forming at least one hole 323 in the dielectric layer 321 and filling up the at least one hole 323 with the fill structure 324 having transparency greater than or equal to that of the dielectric layer 321, a coverage area of the dielectric layer 321 on the first surface 324 can be reduced. By replacing at least one original portion of the dielectric layer 321 with the fill structure 324 having higher transparency, the transparency of the dielectric layer 321 can be improved, thereby improving the transparency of the recombination layer 302.

In addition, in order to ensure the conductive performance of the dielectric layer 321, the fill structure 324 also has tunneling capability of carriers, and the material of the fill structure 324 may be the same as that of the first transparent conductive layer 322. For example, an extension structure of the first transparent conductive layer 322 may be formed as the fill structure 324 using a deposition process.

In addition, the shape of an orthographic projection of the at least one hole 323 on the first surface 341 may be not only a rectangle, but also a polygon such as a triangle, a parallelogram, or the like, and a variety of shapes such as a circle and an ellipse. For convenience of description in the present disclosure, at least one hole having rectangle shape is taken as an example. In application, the shape of the at least one hole 323 may be adjusted as needed.

Figure 7:
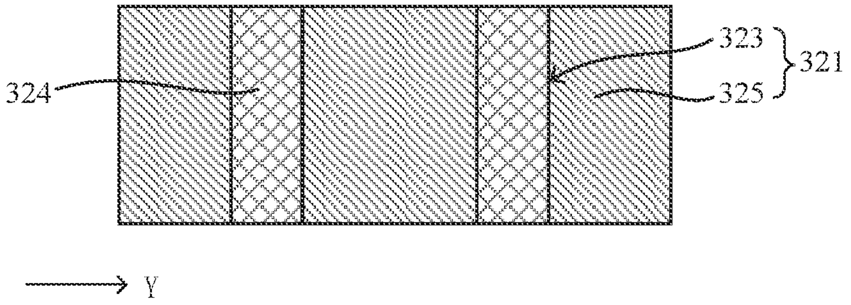
FIG. 7 is a top view of another dielectric layer on the first surface according to some embodiments of the present disclosure.

Referring to both FIG. 5 and FIG. 7, in some embodiments, the dielectric layer 321 includes at least two dielectric portions 325, and the at least one hole 323 spaces apart adjacent dielectric portions 325 of the at least two dielectric portions 325. FIG. 7 is another top view of the dielectric layer 321 on the first surface 323.

When forming the dielectric layer 321, at least one hole 323 may be formed to divide the dielectric layer 321 into at least two dielectric portions 325 which are spaced apart from each other, and adjacent dielectric portions 325 of the at least two dielectric portions 325 are spaced apart by the at least one hole 323. For example, as illustrated in FIG. 7, two holes 323 divide the dielectric layer 321 into three dielectric portions 325 which are spaced apart from each other, such that orthographic projections of the two holes 323 on the first surface 341 has a relative larger area, thereby increasing the proportion of the portions of the dielectric layer 321 which are replaced by the fill structure 324. In this way, the transparency of the dielectric layer 321 and the recombination layer 302 can be effectively improved, and the light absorption amount and photoelectric conversion efficiency of the bottom cell 301 can be increased.

For case of description and understanding, in FIG. 7, a configuration of the dielectric layer 321 including three dielectric portions 325 and two holes 323 is taken as an example. In practice, the dielectric layer 321 may include two dielectric portions 325 and at least one hole 323, or a plurality of dielectric portions 325 and a plurality of holes 323.

In addition, the dielectric portions 325 of the dielectric layer 321 shown in FIG. 7 interleave with the holes 323 along a direction. In practice, the dielectric layer 321 may be formed to include the dielectric portions 325 and the holes 323 distributed randomly, which is not limited in the embodiments of the present disclosure.

Referring to FIG. 7, Y direction refers to a second direction. In some embodiments, the at least two dielectric portions 325 interleave with the at least one hole 323 along the second direction.

When forming the dielectric layer 321, the at least two dielectric portions 325 may be formed to interleave with the at least one hole 323 along a direction. For example, as illustrated in FIG. 7, the dielectric portions 325 interleave with the holes 323 along the second direction. The dielectric layer 321 may be produced by successively forming a plurality of dielectric portions 325 and a plurality of holes 323 using selective deposition, or by forming a plurality of holes 323 and a plurality of dielectric portions 325 successively arranged by performing selectively etching on a formed entire dielectric layer 321. Since the dielectric layer 321 has a regular structure in which the dielectric portions 325 interleave with the holes 323 along the second direction, the difficulty of producing the dielectric layer 321 using an industrial production process is greatly reduced. In this way, not only the transparency of the dielectric layer 321, but also the production efficiency and the overall quality of the dielectric layer 321 can be improved.

Referring to FIG. 7, in some embodiments, a ratio of an area of the orthographic projection of the at least one hole 323 on the first surface 341 to an area of orthographic projections of the at least two dielectric portions 325 on the first surface 341 ranges from 0 to 10.

When forming the dielectric layer 321, the main function of the dielectric layer 321 is to enhance the overall tunneling capability of carriers in the recombination layer 302 utilizing its own good tunneling performance of carriers. The ratio of the area of the orthographic projection of the at least one hole 323 on the first surface 341 to the area of the orthographic projections of the at least two dielectric portions 325 on the first surface 341 is indicative of a ratio of a portion of the dielectric layer 321 having high transparency to a portion of the dielectric layer 321 having high tunneling capability of carriers.

When the ratio of the area of the orthographic projection of the at least one hole 323 to the area of the orthographic projections of the at least two dielectric portions 325 is excessively small, the proportion of the at least one hole 323 in the dielectric layer 321 is excessively small, the transparency of the dielectric layer 321 is poor, bringing a relatively great impact to the light absorption amount of the bottom cell 301, thereby affecting the photoelectric conversion efficiency of the bottom cell 301 and the tandem solar cell. When the ratio of the area of the orthographic projection of the at least one hole 323 to the area of the orthographic projections of the at least two dielectric portions 325 is excessively large, the proportion of the at least one holes 323 in the dielectric layer 321 is excessively large, and the proportion of the at least two dielectric portions 325 with good tunneling capability of carriers is excessively small, resulting in limited enhancement of the tunneling capability of carriers in the recombination layer 302, and limited protection capability of the dielectric layer 321, thereby leading to a relatively large open-circuit voltage loss of the bottom cell 301.

Thus, when forming the dielectric layer 321, the ratio of the area of the orthographic projection of the at least one hole 323 on the first surface 341 to the area of the orthographic projections of the at least two dielectric portions 325 on the first surface 341 may be set within the range of 0 to 10, for example, 0.1, 0.2, 0.5, 0.75, 1, 2, 4, 7.5, 9, or the like. In this way, the transparency of the dielectric layer 321 can be effectively increased, the recombination layer 302 can be ensured to obtain an effective enhancement on the tunneling capability of carriers, and the open-circuit voltage of the bottom cell 301 can be significantly increased.

Figure 8:
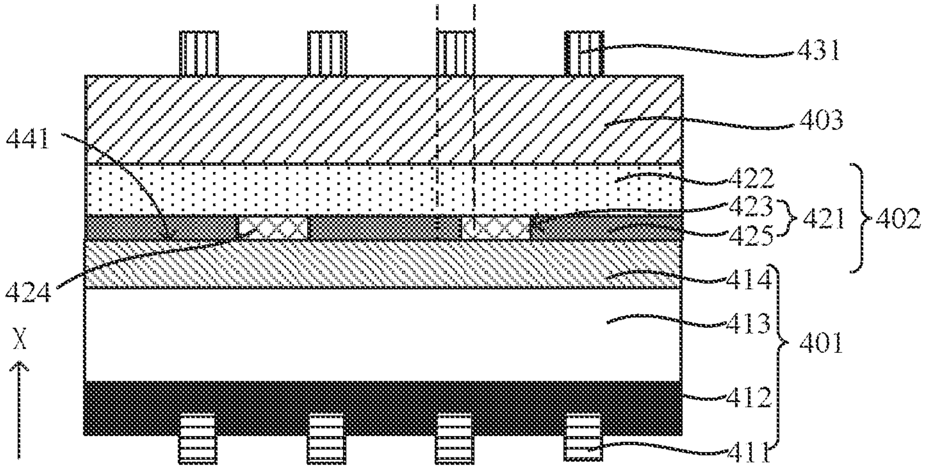
FIG. 8 is a schematic diagram of an overall structure of still another tandem solar cell according to some embodiments of the present disclosure.

Referring to FIG. 8, in some embodiments, the tandem solar cell further includes a plurality of second electrodes 431 formed at intervals along the third direction. The plurality of second electrodes 431 are formed on a surface of a top cell 403 away from a bottom cell 401 in the first direction, and at least part of orthographic projections of the plurality of second electrodes 431 on a dielectric layer 421 is located on at least two dielectric portions 425. FIG. 8 is a diagram schematic of an overall structure of still another tandem solar cell. In FIG. 8, X direction refers to the first direction and Z direction refers to the third direction.

The bottom cell 401, the top cell 403, and a recombination layer 402 in FIG. 8 are similar to the bottom cell 401, the top cell 403, and the recombination layer 402 as described above, respectively. In order to facilitate electric energy output, a plurality of second electrodes 431 may be disposed on a surface of the top cell 403 away from the bottom cell 401 in the first direction, and the plurality of second electrodes 431 are disposed at intervals along the third direction. With reference to the above description of the recombination layer 302, the recombination layer 302 tends to affect the light absorption of the bottom cell 301, and the main cause to this problem is that the dielectric portions 325 of the recombination layer 302 has poor transparency, and the dielectric portions 325 absorb and reflect a large portion of light incident on the dielectric portions 325.

After disposing the second electrodes 431, the second electrodes 431 absorb and reflect a larger portion of light incident on the second electrodes 431, and the light absorption of the portion of the tandem solar cell facing to the second electrodes 431 in the first direction is mainly interfered by the second electrodes 431. The impact on light absorption of the bottom cell 401 caused by the portions of the dielectric portion 425 of the recombination layer 402 which are directly opposite to the second electrodes 431 in the first direction is reduced significantly.

Thus, during formation of the tandem solar cell, the second electrodes 431 disposed along the third direction may be disposed according to the positions of the dielectric portions 425, such that at least part of the dielectric portions 425 has portions directly opposite to the second electrodes 431 along the first direction. That is, orthographic projections of the second electrodes 431 on the first surface 441 are at least partially overlapped with orthographic projections of the dielectric portions 425 on the first surface 441, or at least part of orthographic projections of the second electrodes 431 on the dielectric layer 421 is located on the dielectric portions 425. As such, the impact on light absorption of the bottom cell 401 caused by at least part of the dielectric portions 425 is significantly reduced, thereby reducing the loss of light absorption in the bottom cell 401 caused by the dielectric layer 421, and improving the photoelectric conversion efficiency of the bottom cell 401.

In some embodiments, the second direction and the third direction have a same orientation, or are parallel to each other and have opposite orientations.

When forming the dielectric portions 425, depending on the configuration of the second electrodes 431 on the top cell 403, the direction along which the dielectric portions 425 interleave with the holes 423 and the direction along which the plurality of second electrodes 431 are disposed at intervals may be designed to have a same orientation, or are parallel to each other and have opposite orientations. When forming the dielectric layer 421, a length direction of the holes 423 may be consistent with a length direction of the second electrodes 431, such that the dielectric portions 425 of the dielectric layer 421 are disposed similar to the second electrodes 431. In this way, aesthetics can be improved, and it is convenient to control the proportion of the portions of the dielectric portions 425 directly opposite to the second electrodes 431 in the dielectric portions 425 by adjusting along a disposition direction.

In addition, in practice, a straight line extending along the second direction and a straight line extending along the third direction may also be perpendicular to each other or have an included angle of less than 90 degrees therebetween, for example, an included angle of 30 degrees, 45 degrees, 60 degrees, or the like.

Figure 9:
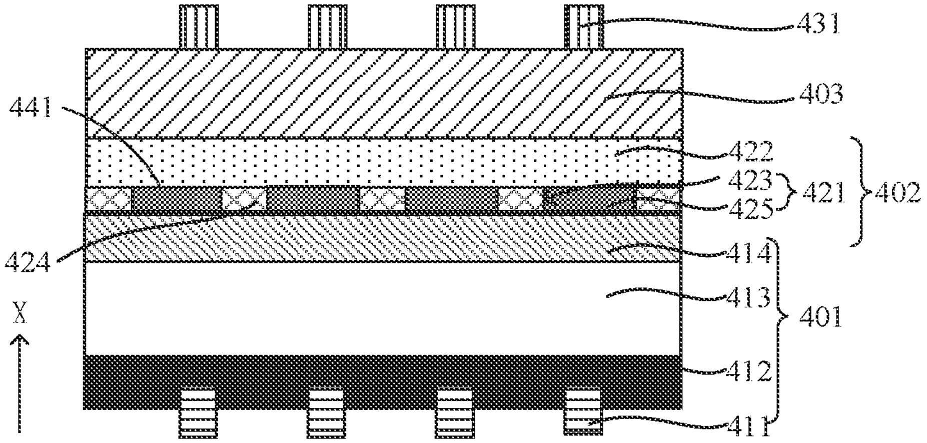
FIG. 9 is a schematic diagram of an overall structure of one more tandem solar cell according to some embodiments of the present disclosure.
Figure 10:
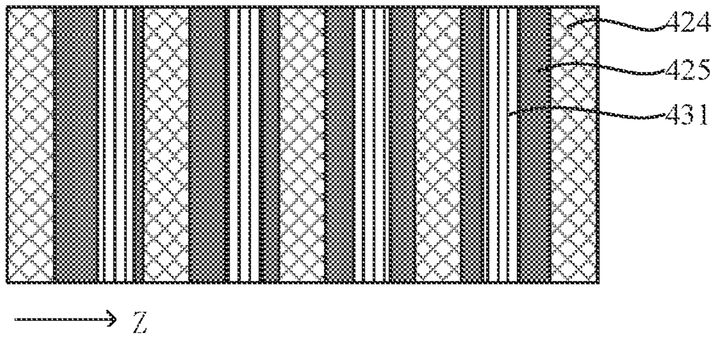
FIG. 10 is a structural schematic diagram of orthographic projections of a plurality of second electrodes on the dielectric layer according to some embodiments of the present disclosure.

Referring to both FIG. 9 and FIG. 10, in some embodiments, the orthographic projections of the plurality of second electrodes 431 on the dielectric layer 421 is located on the at least two dielectric portions 425.

FIG. 9 is a schematic diagram of an overall structure of one more tandem solar cell. In FIG. 9, X direction represent the first direction. FIG. 10 is a structural schematic diagram of orthographic projections of the plurality of second electrodes 431 on the dielectric layer 421.

In conjunction with the above description regarding the impact on the light absorption of the tandem solar cell caused by the second electrodes 431, the disposition direction of the second electrodes 431 may be consistent with the disposition direction along which the dielectric portions 425 interleave with the holes 423 in the dielectric layer 421, such that the dielectric portions 425 are disposed similar to the second electrodes 431. To further reduce the impact on the light absorption amount of the bottom cell 401 caused by the dielectric portions 425, the dielectric portions 425 may be disposed to be directly opposite to the second electrodes 431 as possible, such that a proportion of the portions in the dielectric portions 425 which are directly opposite to the second electrodes 431 is as large as possible, i.e., such that the orthographic projections of the second electrodes 431 on the first surface 441 are located within the orthographic projections of the dielectric portions 425 on the first surface 441, or the orthographic projections of the second electrodes 431 on the dielectric layer 421 are entirely located on the dielectric portions 425.

By disposing the dielectric portions 425 to be directly opposite to the second electrodes 431 as possible, the orthographic projections of the second electrodes 431 on the dielectric layer 421 are completely located on the dielectric portions 425. In this way, the proportion of the portions of the dielectric layer 421 that cause a relatively small impact on light absorption of the bottom cell 401 can be greatly increased, the impact on the light absorption amount of the bottom cell 401 caused by the dielectric layer 421 can be reduced as much as possible, and the light absorption amount of the bottom cell 401 can be improved.

In addition, FIG. 10 illustrates that the second direction and the third direction have a same orientation, the length direction of the dielectric portions 425 is consistent with the length direction of the second electrodes 431, and is perpendicular to the second direction and the third direction. In some other embodiments, an adjustment may be made to the length direction and/or the disposition direction of the dielectric portions 425, as long as it is ensured that the orthographic projections of the second electrodes 431 on the dielectric layer 421 are completely located on the dielectric portions 425.

Figure 11:
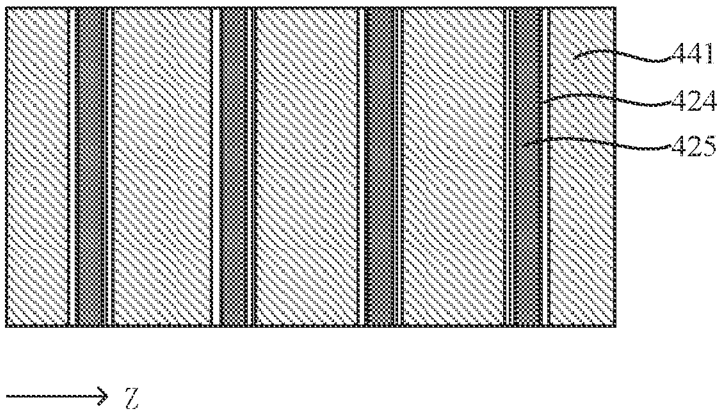
FIG. 11 is a structural schematic diagram of orthographic projections of dielectric portions and the plurality of second electrodes on the first surface according to some embodiments of the present disclosure.

Referring to FIG. 9 and FIG. 11, FIG. 11 is a structural schematic diagram of orthographic projections of dielectric portions 425 and the plurality of second electrodes 431 on the first surface 441. When forming the dielectric layer 421, at least one of the second direction, the length direction of the dielectric portions 425, and the widths of the dielectric portions 425 in the second direction may be adjusted, such that the orthographic projections of the dielectric portions 425 on the first surface 441 are entirely located within the orthographic projections of the second electrodes 431 on the first surface 441. For example, the second direction and the third direction are parallel to each other and have opposite orientations, the length direction of the dielectric portions 425 is consistent with the length direction of the second electrodes 431, and the widths of the dielectric portions 425 in the second direction are equal to the widths of the second electrodes 431 in the third direction, or the widths of the dielectric portions 425 in the second direction are smaller than the widths of the second electrodes 431 in the third direction. In this way, the dielectric portions 425 of the dielectric layer 421 are disposed in a way same as the second electrodes 431, and each dielectric portion of the dielectric portions 425 is directly opposite to a corresponding second electrode of the second electrodes 431 in the first direction.

In FIG. 11, the second direction and the third direction have a same orientation, and the widths of the dielectric portions 425 in the second direction are smaller than the widths of the second electrodes 431 in the third direction. In practice, the widths of the dielectric portions 425 in the second direction may be equal to the widths of the second electrodes 431 in the third direction.

By adjusting the parameters such as the sizes, the disposition direction and the length direction of the dielectric portions 425, all the dielectric portions 425 are disposed directly under the second electrodes 431 in the first direction, such that the light absorption of the tandem solar cell is mainly affected by the second electrodes 431. In this way, the impact on the light absorption amount of the bottom cell 501 caused by the dielectric portions 425 can be reduced as much as possible, and the photoelectric conversion efficiency of the bottom cell 501 can be improved.

Referring to FIG. 5, in some embodiments, a refractive index of the first transparent conductive layer 322 is less than a refractive index of the fill structure 324.

With reference to the above description of the recombination layer 302, the recombination layer 302 affects the light absorption of the bottom cell 301, thereby affecting the photovoltaic conversion efficiency of the tandem solar cell. In the case where the light absorption rate is unchanged, the light absorption amount of the bottom cell 301 is mainly determined by the intensity of the incident light received by the bottom cell 301, and the impact on the intensity of the incident light received by the bottom cell 301 caused by the recombination layer 302 is mainly reflected in two aspects. One is the absorption of the light passing through the top cell 303 by the recombination layer 302, and the other is the reflection of the light passing through the top cell 303 by the recombination layer 302.

In the process that the light passes through the recombination layer 302, in the case where refractive indexes of the first transparent conductive layer 322 and the fill structure 324 are constant or approximately constant, and a refractive index of the fill structure 324 is approximately equal to or equal to the refractive index of the first transparent conductive layer 322, the recombination layer 302 has a relatively strong reflection capability for incident light, which causes the recombination layer 302 to reflect a relatively large portion of the light that is absorbable by the bottom cell 301 away from the bottom cell 301, such that the light absorption amount of the bottom cell 301 is reduced.

Based on the principle of light reflection and refraction, in the case where light passes through a medium with a gradually increasing refractive index, the reflection of light may be greatly reduced. Therefore, when forming the recombination layer 302, the refractive index of the first transparent conductive layer 322 and the refractive index of the fill structure 324 may be set to different magnitudes, and the refractive index of the fill structure 324 is larger than the refractive index of the first transparent conductive layer 322. With regard to incident light directly opposite to the fill structure 324 in the first direction, in the process of arriving to the bottom cell 301, the light successively passes through a two layers of medium having increasing refractive indexes, and the reflection capability of the recombination layer 302 for this part of the light passing through the top cell 203 is significantly reduced. In this way, the reflection of the light absorbable by the bottom cell 301 by the recombination layer 302 can be reduced, and the light absorption amount of the bottom cell 301 can be increased, thereby improving the photoelectric conversion efficiency of the bottom cell 301 and the tandem solar cell.

It is to be understood that the refractive index of the first transparent conductive layer 322 and the refractive index of the fill structure 324 herein both refer to specific refractive indexes, for example, an average refractive index, a minimum refractive index, or a maximum refractive index of a film layer, or the like.

In some embodiments, along the first direction, the refractive index of the fill structure 324 decreases in stages, and/or the refractive index of the first transparent conductive layer 322 decreases in stages.

To further reduce the impact on the light absorption amount of the bottom cell 301 caused by the recombination layer 302, the refractive index of the first transparent conductive layer 322 may be set to decrease in stages along the first direction, and/or the refractive index of the fill structure 324 may be set to decrease in stages along the first direction, such that the first transparent conductive layer 322 has a further reduced capability to reflect light, and/or the fill structure 324 has a further reduced capability to reflect light. In this way, an overall light reflection capability of the recombination layer 302 can be further reduced.

Figure 12:
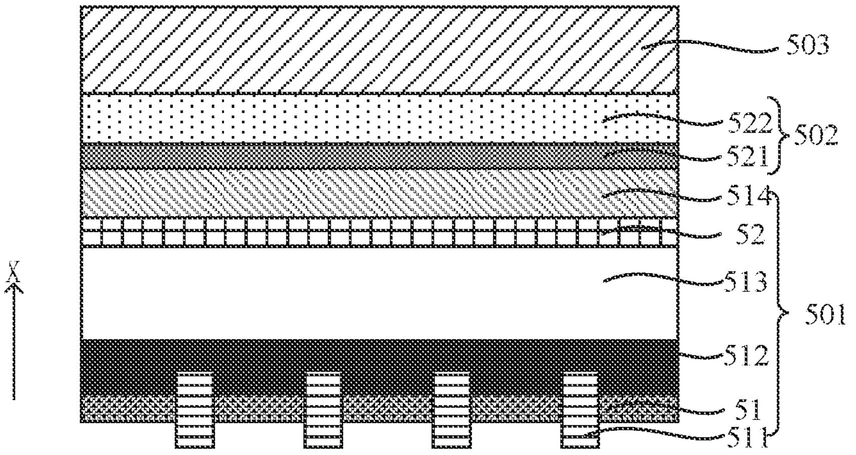
FIG. 12 is a schematic diagram of an overall structure of one more tandem solar cell according to some embodiments of the present disclosure.

Referring to FIG. 12, in some embodiments, the bottom cell 501 further includes a passivation layer 51 and a tunneling layer 52. The tunneling layer 52 is disposed between a second semiconductor conductive layer 514 and a substrate 513, the passivation layer 51 is disposed on a surface of a first semiconductor conductive layer 512 away from the substrate 513, and at least one first electrode 511 penetrates the passivation layer 51 and is in ohmic contact with the first semiconductor conductive layer 512. FIG. 12 is a schematic diagram of an overall structure of one more tandem solar cell. In FIG. 12, X direction represents the first direction.

A complete passivation layer 51 is formed on a side of the bottom cell 501 away from a top cell 503. The passivation layer 51 can effectively eliminate interface defects of the first semiconductor conductive layer 512, thereby reducing carrier recombination occurred on the surface of the first semiconductor conductive layer 512 of the bottom cell 501, and reducing the recombination current of the bottom cell 501. In this way, the photoelectric conversion efficiency of the bottom cell 501 can be effectively improved.

A tunneling layer 52 is formed between the second semiconductor conductive layer 514 and the substrate 513 of the bottom cell 501. The second semiconductor conductive layer 514 and the substrate 513 have a same doping type, and the second semiconductor conductive layer 514 and the tunneling layer 52 form a passivation contact structure, so as to provide good field passivation and interface passivation effects. In this way, the recombination current of the substrate 513 on the side of the second semiconductor conductive layer 514 can be effectively reduced, and the open-circuit voltage of the bottom cell 501 can be increased. In this way, the photoelectric conversion efficiency of the bottom cell 501 can be improved.

In addition, in the embodiments of the present disclosure, the tunneling layer 52 forming between the second semiconductor conductive layer 514 and the substrate 513, and the second semiconductor conductive layer 514 having a same doping type as the substrate 513 are taken as an example. In practice, the tunneling layer 52 may also be formed between the first semiconductor conductive layer 512 and the substrate 513, and the first semiconductor conductive layer 52 and the substrate 513 have a same doping type, which are not limited in the embodiments of the present disclosure.

In addition, in the embodiments of the present disclosure, the bottom cell 501 having both the passivation layer 51 and the tunneling layer 52 is taken as an example. In practice, the bottom cell 501 may include only the passivation layer 51 or only the tunneling layer 52.

In some embodiments, a material of the passivation layer 51 includes: at least one of silicon oxide, aluminum oxide, silicon nitride, or silicon oxynitride, and the passivation layer 51 has a single-layer structure or a multiple-layer structure. For a multiple-layer structure, the layers are stacked in the first direction, materials of the different layers may be different, or the materials of some layers may be the same but different from the materials of other layers. For example, the multiple-layer structure may be a double-layer structure including a silicon nitride layer and an aluminum oxide layer which are stacked.

In some embodiments, the top cell 503 includes a perovskite thin-film solar cell, a copper indium gallium diselenide (CIGS) thin-film solar cell, a cadmium telluride (CdTe) thin-film solar cell, an amorphous silicon thin-film solar cell, or a group-III-to-V thin-film solar cell.

In order to improve the utilization rate of incident light by the tandem solar cell, the top cell 503 and the bottom cell 501 generally absorb light of different wavelengths based on the energy gaps of their own materials. The wavelength of light which may be efficiently utilized by the bottom cell 501 generally ranges from 600 nm to 1200 nm. Thus, a cell with an energy gap of about 1.55 ev may be selected as the top cell 503 to prevent the top cell 503 from absorbing incident light of a wavelength greater than or equal to 800 nm. Therefore, the top cell 503 may be any one of a perovskite thin-film solar cell, a CIGS thin-film solar cell, a CdTe thin-film solar cell, an amorphous silicon thin-film solar cell, or a group-III-to-V thin-film solar cell.

Figure 13:
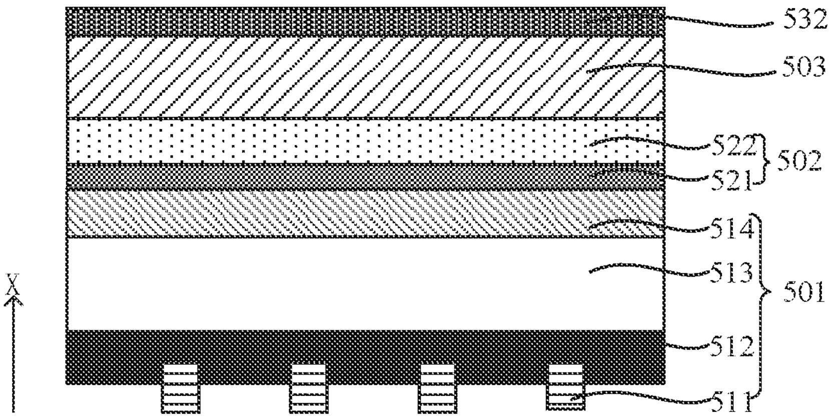
FIG. 13 is a schematic diagram of an overall structure of one more tandem solar cell according to some embodiments of the present disclosure.

Referring to FIG. 13, in some embodiments, the top cell 503 includes a second transparent conductive layer 532, and a refractive index of the second transparent conductive layer 532 decreases in stages along the first direction.

The refractive index of the second transparent conductive layer 532 decreases in stages along the first direction, such that the second transparent conductive layer 532 may be regarded as being formed of a multi-layer medium with a refractive index decreasing in stages along the first direction. In this way, the light reflection capability of the second transparent conductive layer 532 can be reduced, the proportion of incident light passing through the second transparent conductive layer 532 to arrive to the top cell 503 can be increased, thereby improving the light absorption amount and the photoelectric conversion efficiency of the top cell 503.

In some embodiments, the second transparent conductive layer 532 includes at least two transparent conductive films stacked in the first direction, and the refractive indexes of the at least two transparent conductive films decrease in stages along the first direction. The refractive indexes of the transparent conductive films gradually decrease along the first direction, such that the second transparent conductive layer 532 is formed of a plurality of transparent conductive films with refractive indexes decreasing in stages along the first direction. In this way, the light reflection capability of the second transparent conductive layer 532 can be reduced, the proportion of incident light passing through the second transparent conductive layer 532 to arrive to the top cell 503 can be increased, thereby improving the light absorption amount and the photoelectric conversion efficiency of the top cell 503.

It is to be understood that the refractive indexes of transparent conductive films decreasing in stages in the first direction herein means that the refractive index of each transparent conductive film is regarded as a fixed value, respectively. For example, the refractive indexes of the transparent conductive films decrease with the increase of a distance between one respective transparent conductive film and the bottom cell 301 along the first direction when the refractive indexes of the transparent conductive films are defined using an average refractive index, a minimum refractive index, or a maximum refractive index of the transparent conductive films.

It should be noted that the features in the above-mentioned embodiments may not only be present in a tandem solar cell separately, but also may be implemented in combination with each other without technical conflicts and without departing from the inventive concept of the embodiments of the present disclosure, and the embodiments of the present disclosure are not described in detail herein any further.

Embodiments of the present disclosure provide a solar cell. In the solar cell, an electrode structure on a side of the bottom cell is removed, and the recombination layer functions as an intermediate layer to contact with the top cell and the bottom cell. The recombination layer includes the dielectric layer and the first transparent conductive structure stacked in the first direction, and the dielectric layer is conducive to enhancing tunneling capability of carriers in the recombination layer, thereby reducing recombination loss of the carriers in the recombination layer. Since the dielectric layer is disposed on the second semiconductor conductive layer of the bottom cell, the dielectric layer functions as a protection film, which is capable of effectively reducing damages to the second semiconductor conductive layer during formation of the first transparent conductive layer, thereby ensuring that the bottom cell has a higher open-circuit voltage and a better photoelectric conversion performance. In addition, the dielectric layer can further provide surface passivation to the second semiconductor conductive layer, such that interface defects of the second semiconductor conductive layer can be reduced. In this way, the open-circuit voltage of the bottom cell can be increased, the recombination of carriers on a surface of the second semiconductor conductive layer of the bottom cell can be reduced, thereby improving the photoelectric conversion efficiency of the bottom cell and the tandem solar cell.

Figure 14:
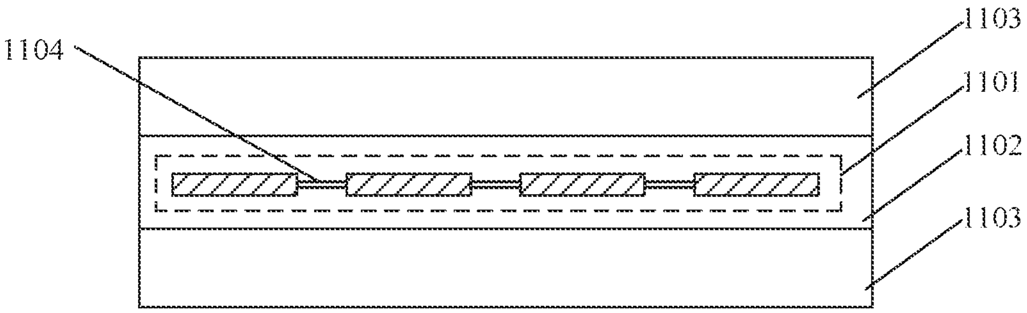
FIG. 14 is a structural schematic diagram of a photovoltaic module according to some embodiments of the present disclosure.

Some embodiments of the present disclosure further provide a photovoltaic module. Referring to FIG. 14, the photovoltaic module includes: at least one cell string 1101 formed by connecting a plurality of the solar cells as described above, at least one encapsulation layer 1102 configured to cover a surface of the at least one cell string, and at least one cover plate 1103 configured to cover a surface of the at least one encapsulation layer 1102 away from the at least one cell string 1101. The solar cells that are in a single piece or in multiple pieces are electrically connected to form a plurality of cell strings 1102, and the plurality of cell strings 1102 are electrically connected in series and/or in parallel.

In some embodiments, the plurality of cell strings 1102 may be electrically connected by conductive strips 1104. The encapsulation layers 1102 cover front surfaces and rear surfaces of the solar cells. In some embodiments, the encapsulation layers 1102 may be an organic encapsulation adhesive film such as an ethylene-vinyl acetate copolymer (EVA) adhesive film, a polyethylene octene co-elastomer (POE) adhesive film, or a polyethylene terephthalate (PET) adhesive film. In some embodiments, the at least one cover plate 1103 may be a glass cover plate, a plastic cover plate, or the like that has a light transmission function. A surface of the at least one cover plate 1103 facing to the encapsulation layers 1102 may be a textured surface, thereby increasing the utilization rate of incident light.

Although the present disclosure is described above with reference to the preferable embodiments, the embodiments are not intended to limit the present disclosure. Those skilled in the art may make, within the concept of the present disclosure, various possible variations and modifications without departing from the spirit and scope of the present disclosure. Therefore, the protection scope of the present disclosure shall be subjected to the scope defined by the claims of the present disclosure.

What is claimed is:

1. A solar cell, comprising:

a bottom cell, a recombination layer, and a top cell stacked in a first direction;

wherein the bottom cell includes a first semiconductor conductive layer, a substrate, and a second semiconductor conductive layer stacked in the first direction, and further includes at least one first electrode formed on a side of the first semiconductor conductive layer facing away from the substrate, the second semiconductor conductive layer has a first surface facing the top cell;

wherein the recombination layer includes a dielectric layer formed on at least a portion of the first surface and a first transparent conductive layer formed on the dielectric layer and disposed between the dielectric layer and the top cell;

wherein the dielectric layer includes at least one through hole that divides the dielectric layer into at least two dielectric portions, and each of the at least one through hole is between adjacent dielectric portions of the at least two dielectric portions;

wherein the at least one through hole is filled with a material having transparency greater than or equal to transparency of the dielectric layer, and a refractive index greater than a refractive index of the first transparent conductive layer;

wherein the solar cell further includes a plurality of second electrodes formed at intervals along a third direction; and wherein the plurality of second electrodes are formed on a surface of the top cell away from the bottom cell, and each of the plurality of second electrodes at least partially overlaps with one of the at least two dielectric portions in the third direction.

2. The solar cell according to claim 1, wherein a ratio of an area of an orthographic projection of the dielectric layer on the first surface to an area of the first surface ranges from 0.5 to 1.

3. The solar cell according to claim 1, wherein in the first direction, a ratio of a thickness of the dielectric layer to a thickness of the recombination layer ranges from 0.025 to 0.5.

4. The solar cell according to claim 1, wherein the first transparent conductive layer is formed on the dielectric layer and covers one or more portions of the first surface that are not covered by the dielectric layer.

5. The solar cell according to claim 1, wherein the at least two dielectric portions interleave with the at least one hole along a second direction.

6. The solar cell according to claim 5, wherein the second direction and the third direction have a same orientation, or are parallel to each other and have opposite orientations.

7. The solar cell according to claim 6, wherein orthographic projections of the plurality of second electrodes on the dielectric layer are located on the at least two dielectric portions.

8. The solar cell according to claim 1, wherein a ratio of an area of an orthographic projection of the at least one hole on the first surface to an area of orthographic projections of the at least two dielectric portions on the first surface is greater than 0 and less than or equal to 10.

9. The solar cell according to claim 1, wherein the bottom cell further includes a tunneling layer and a first passivation layer;

wherein the tunneling layer is disposed between the second semiconductor conductive layer and the substrate; and wherein the first passivation layer is disposed on a surface of the first semiconductor conductive layer away from the substrate, and the at least one first electrode penetrates through the first passivation layer and is in ohmic contact with the first semiconductor conductive layer.

10. The solar cell according to claim 1, wherein the top cell further includes a second transparent conductive layer having a refractive index decreasing in stages along the first direction.

11. A photovoltaic module, comprising:

at least one cell string, formed by connecting a plurality of solar cells;

at least one encapsulation layer, configured to cover a surface of the at least one cell string; and at least one cover plate, configured to cover a surface of the at least one encapsulation layer away from the at least one cell string;

wherein each solar cell of the plurality of solar cells includes:

a bottom cell, a recombination layer, and a top cell stacked in a first direction;

wherein the bottom cell includes a first semiconductor conductive layer, a substrate, and a second semiconductor conductive layer stacked in the first direction, and further includes at least one first electrode formed on a side of the first semiconductor conductive layer facing away from the substrate, the second semiconductor conductive layer has a first surface facing the top cell; and wherein the recombination layer includes a dielectric layer formed on at least a portion of the first surface and a first transparent conductive layer formed on the dielectric layer and disposed between the dielectric layer and the top cell;

wherein the dielectric layer includes at least one through hole that divides the dielectric layer into at least two dielectric portions, and each of the at least one hole is between adjacent dielectric portions of the at least two dielectric portions;

wherein the at least one through hole is filled with a material having transparency greater than or equal to transparency of the dielectric layer, and a refractive index greater than a refractive index of the first transparent conductive layer;

wherein each solar cell further includes a plurality of second electrodes formed at intervals along a third direction; and wherein the plurality of second electrodes are formed on a surface of the top cell away from the bottom cell, and each of the plurality of second electrodes on the dielectric layer at least partially overlaps with one of the at least two dielectric portions.

12. The photovoltaic module according to claim 11, wherein a ratio of an area of an orthographic projection of the dielectric layer on the first surface to an area of the first surface ranges from 0.5 to 1.

13. The photovoltaic module according to claim 11, wherein in the first direction, a ratio of a thickness of the dielectric layer to a thickness of the recombination layer ranges from 0.025 to 0.5.

14. The photovoltaic module according to claim 11, wherein the at least two dielectric portions interleave with the at least one hole along a second direction.

15. The photovoltaic module according to claim 14, wherein the second direction and the third direction have a same orientation, or are parallel to each other and have opposite orientations.

* * * * *